US007566684B1

(12) United States Patent
Levin et al.

(10) Patent No.: US 7,566,684 B1
(45) Date of Patent: Jul. 28, 2009

(54) MACHINERY WINDINGS OF YTTRIUM BARIUM COPPER OXIDE AND RELATED COATED CONDUCTOR

(75) Inventors: George A. Levin, Dayton, OH (US); Paul N. Barnes, West Milton, OH (US)

(73) Assignee: The United States of America as represented by the Secretary of the Air Force, Washington, DC (US)

( * ) Notice: Subject to any disclaimer, the term of this patent is extended or adjusted under 35 U.S.C. 154(b) by 124 days.

(21) Appl. No.: 11/513,400

(22) Filed: Aug. 24, 2006

(51) Int. Cl.

| | |
|---|---|
| ***H01L 39/24*** | (2006.01) |
| ***H01B 12/00*** | (2006.01) |
| ***H01F 6/00*** | (2006.01) |
| ***H01F 7/06*** | (2006.01) |
| ***H01M 10/50*** | (2006.01) |
| ***H01M 6/36*** | (2006.01) |
| ***H01M 6/38*** | (2006.01) |

(52) U.S. Cl. ....................... 505/430; 505/433; 505/230; 505/739; 29/599; 29/606; 427/62; 427/116

(58) Field of Classification Search ................. 505/430, 505/433, 150, 739, 230, 211; 29/599, 600, 29/606; 361/29, 43; 427/116, 62
See application file for complete search history.

(56) References Cited

U.S. PATENT DOCUMENTS

| | | | | |
|---|---|---|---|---|
| 3,720,847 | A * | 3/1973 | Massar | 327/370 |
| 3,928,832 | A | 12/1975 | Forsberg et al. | |
| 4,330,726 | A | 5/1982 | Albright et al. | |
| 4,513,272 | A * | 4/1985 | Verweel et al. | 335/284 |
| 4,578,610 | A | 3/1986 | Kliman et al. | |
| 4,820,688 | A * | 4/1989 | Jasper, Jr. | 505/200 |
| 5,389,908 | A | 2/1995 | Sawada | |
| 5,827,797 | A | 10/1998 | Cass et al. | |
| 6,370,762 | B1 | 4/2002 | Li et al. | |
| 6,395,080 | B1 | 5/2002 | Cass et al. | |
| 6,489,701 | B1 | 12/2002 | Gamble et al. | |
| 6,574,852 | B2 * | 6/2003 | Zhou | 29/599 |
| 6,957,093 | B2 | 10/2005 | Han | |
| 2002/0113336 | A1 | 8/2002 | Cass et al. | |
| 2003/0032560 | A1 | 2/2003 | Otto et al. | |

OTHER PUBLICATIONS

G.A. Levin et al., "Multifilament $YBa_2Cu_3O_{6+x}$-coated Conductors with Minimized Coupling Losses", Applied Physics Letters, 2006, pp. 012506, vol. 89.

(Continued)

*Primary Examiner*—Karl E Group
*Assistant Examiner*—Noah S Wiese
(74) *Attorney, Agent, or Firm*—AFMCLO/JAZ; Gerald B. Hollins

(57) ABSTRACT

A superconductor coating inclusive, tape-like electrical conductor and windings using such conductor for magnets and electrical machines, etc. The described windings are suited for inclusion of successor superconductor materials such as yttrium barium copper oxide wherein magnetic flux related losses can potentially be excessive and preclude successful machine operation. Winding orientation and configuration of the conductor in an alternating current machine for lower losses are disclosed along with methods and apparatus for achieving the desired windings. Windings intended for differing locations within a machine of this type are made possible by the invention. Equations relating to magnetic losses incurred in such windings are also disclosed.

17 Claims, 7 Drawing Sheets

OTHER PUBLICATIONS

M. Polak et al., "AC Losses in a $YBa_2Cu_3O_{7-x}$ Coil", Applied Physics Letters, 2006, pp. 232501, vol. 89.

S.W. Kim et al., "Soldered Double Pancake Winding of High Temperature Superconducting Tape", IEEE Transactions on Applied Superconductivity, Jun. 2003, pp. 1784-1787, vol. 13, No. 2.

Y.Y. Xie et al., "Progress in Scale-Up of Second-Generation High-Temperature Superconductors at SuperPower Inc.", Physica C 426-431, 2005, pp. 849-857, Elsevier.

C. Oberly et al., "AC Loss Analysis for Superconducting Generator Armatures Wound with Subdivided Y-Ba-Cu-O Coated Tape", Cryogenics, 2001, pp. 117-124, vol. 41, Elsevier.

M. Polak et al., "YBCO/Ag Boundary Resistivity in YBCO Tapes with Metallic Substrates", Superconductor Science and Technology, 2006, pp. 817-820, vol. 19.

P. Min et al, "Rotating Electric Machine with Superconducting Winding and a Method for Manufacturing the Same", PCT Application 0007286, Feb. 10, 2000.

* cited by examiner

MACHINERY WINDINGS OF YTTRIUM BARIUM COPPER OXIDE AND RELATED COATED CONDUCTOR

RIGHTS OF THE GOVERNMENT

The invention described herein may be manufactured and used by or for the Government of the United States for all governmental purposes without the payment of any royalty.

BACKGROUND OF THE INVENTION

High temperature superconducting (HTS) electrical motors, generators, and transformers can be significantly lighter in weight and smaller than their conventional counterpart machines. Continuing development of such machines is needed for use in advanced military and civilian equipment especially in the development of space and airborne systems where both weight and size considerations are of prime importance. The use of winding materials based on a flat uniform or filamented tape of high current density second generation superconductor materials such as yttrium barium copper oxide (YBCO, $YBa_2Cu_3O_{7x}$) in the machine windings appears to offer a promising avenue toward machines of the needed types.

Two major shortcomings of superconductors, such as yttrium barium copper oxide coated superconductors, need to be overcome, however, in order to permit their widespread implementation into alternating current electrical machinery applications such as armature and field winding in motors and generators and transformer windings [1]. (Bracketed numbers such as this [1] refer to the list of reference documents appearing at the end of this specification; these documents and each other document identified in this text are hereby incorporated by reference herein.)

One issue associated with yttrium barium copper oxide coated conductors, manufactured in the form of thin and relatively wide tapes, for example, is the high hysteresis loss occurring when such a conductor is disposed in a time-varying magnetic field. Another issue concerns attendant mechanical properties of the conductor that are very different from the properties of traditional material such as copper Litz wire. Bending strain limitations restrict the types of winding configurations that are possible when such conductors are compared to copper. A route to hysteresis (and overall) loss reduction explored in recent years is replacement of the uniform wide yttrium barium copper oxide film with a set of parallel narrow filaments or stripes or striations [2-6]. Early work has suggested that in time the hysteresis loss in experimental multifilamentary samples can be reduced by at least an order of magnitude.

Notwithstanding such hysteresis loss improvement however, another type of loss specific to multifilamentary coated conductors—i.e., coupling loss—can become comparable in size to the hysteresis loss at a sweep rate Bf of a few Tesla per second when the conductor twist pitch is for example equal to 20 centimeters (here B is the amplitude of the magnetic field and f is the field change frequency) [1]. In order to achieve a substantial—i.e., one or two orders of magnitude—reduction in total losses (hysteresis and coupling) at an operating sweep rate of at least 10 Tesla per second, measures need to be taken to reduce both hysteresis and coupling losses.

Another shortcoming of coated superconductors is their low tolerance to bending and twisting strain. This conductor characteristic requires an almost complete reexamination of the winding techniques used with such conductors. The problems of alternating current losses and mechanical properties of the conductor become intertwined because twisting of the multifilamentary conductor is necessary in order to limit coupling losses. The present invention presents novel approaches to arranging magnets and coils with second generation superconductors such as yttrium barium copper oxide coated conductors.

SUMMARY OF THE INVENTION

The present invention provides conductor geometry and winding arrangements improving on the performance of superconductor based winding materials; the invention is particularly concerned with high temperature superconductor coated conductor winding material, for example, the yttrium barium copper oxide-coated superconductor.

It is an object of the present invention therefore to provide second generation superconductor materials in alternating and direct current electrical machines.

It is an object of the present invention to provide second generation superconductor winding configurations for alternating and direct current electrical machines.

It is an object of the present invention to provide magnet and coil windings usable in electromagnetic applications in general.

It is an object of the present invention to provide second generation superconductor winding arrangements usable in both rotor and stator portions of an electrical machine.

It is another object of the invention to provide exemplary processes for forming superconductor windings while observing restrictive properties of the materials used.

It is another object of the invention to provide a convenient method for fabricating high temperature superconductor coated conductor winding materials.

It is another object of the invention to provide a method for achieving electrical winding arrangements usable in a plurality of electrical machines.

It is another object of the invention to provide tools for achieving desirable superconductor inclusive electrical winding arrangements.

These and other objects of the invention will become apparent as the description of the representative embodiments proceeds.

These and other objects of the invention are achieved by a superconductor film inclusive alternating current electrical machine winding comprising the combination of:

a superconductor film layer included tape-like electrical conductor having a tape width, W, greater than a tape thickness, T, said conductor being disposed into a magnetic pole-generating plurality of turns of said machine winding;

said machine winding electrical conductor tape including a plurality of lengthwise extending segregated parallel filament striations disposed across said tape width, W into said superconductor film layer;

said electrical conductor tape plurality of turns each including a filament striation direction-altering winding turn curvature portion wherein each generally coplanar and parallel filament active segment striation curves into an inactive segment filament striation interconnection region of cusp like profile and interconnecting conductors having parallel disposition and orthogonal orientation with respect to said filament active segment striations.

BRIEF DESCRIPTION OF THE DRAWING

The accompanying drawings, incorporated in and forming a part of the specification, illustrate several aspects of the present invention and together with the description serve to explain the principles of the invention. In the drawings.

DETAILED DESCRIPTION OF THE INVENTION

Figure 1A:
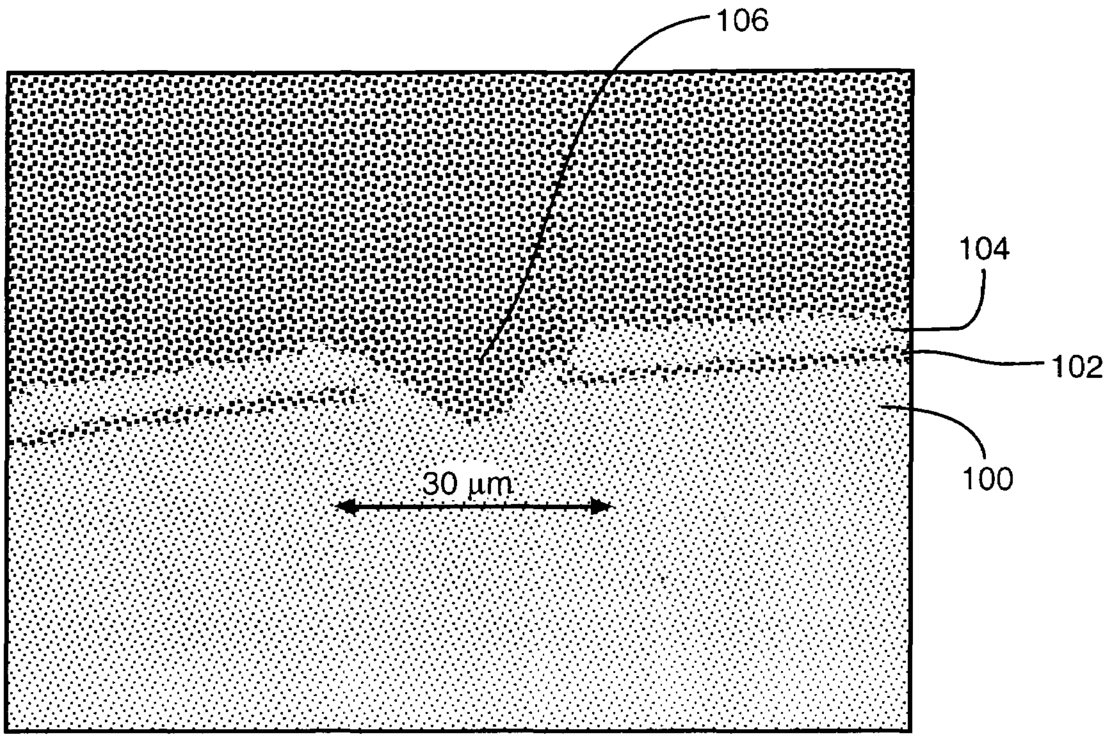
FIG. 1 includes the views of FIG. 1*a* and FIG. 1*b* and shows a cross sectional view of a yttrium barium copper oxide inclusive superconductor element and comparison views of non striated and a striated superconductor elements respectively.

Second generation high temperature superconductor structures may be formed into wires and tape-like conductors in which a thin superconducting film is deposited on a metallic substrate. On top of the superconducting film a layer of silver and copper, a stabilizer, is often attached. An example of such a coated conductor is shown in the FIG. 1(*a*) drawing herein wherein a drawn representation of a profile microphotograph of an alternating current superconductor material is shown. In this FIG. 1 drawing a substrate made of for example Hastelloy material appears at 100, a thin layer of yttrium barium copper oxide superconductor material appears at 102 and a silver protective layer is shown at 104. The groove at 106 in FIG. 1 represents a laser ablation achieved electrical segregation between adjacent striation conductors and is accomplished for electrical insulation purposes; more on this topic later herein.

Figure 1B:
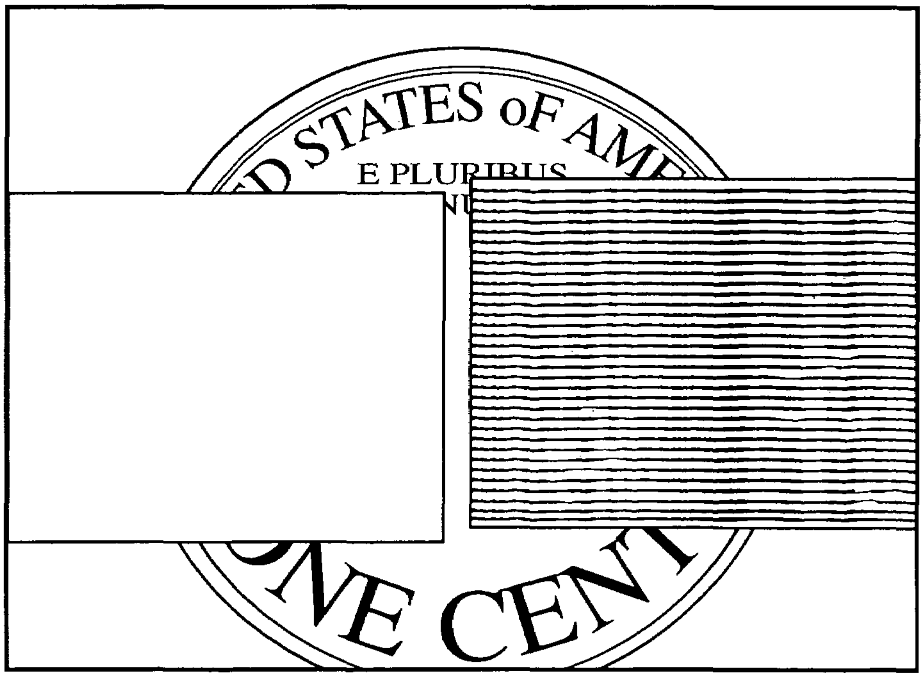

Coated conductors with a non-segregated superconducting layer can be used in direct current winding applications, such as in field coils for motors and generators. In alternating current winding applications, such as in transformers, alternating current transmission lines and armatures of motors and generators, the winding conductors are exposed to time-varying magnetic field. This exposure can lead to large energy losses through hysteresis effects. In order to decrease magnetic hysteresis losses in alternating magnetic fields a superconducting film can be subdivided into thin filaments or striations. The resulting multifilamentary structure of the conductor may be described as a tape including parallel thin strips of high temperature superconductor material separated by non-superconducting, resistive barriers. Such material as achieved by laser ablation is represented in FIG. 1*b*, right hand conductor; in FIG. 7 and indeed in FIG. 1*a* herein. The left hand conductor in FIG. 1*b* is of the non striated superconductor type, the FIG. 1 background represents a standard U.S. penny coin included for size comparison with a typical winding conductor. The hysteresis loss in a superconducting tape is directly proportional to the width of the tape when the tape is fully penetrated by a magnetic field. When the superconductor tape is subdivided into striations or filaments as in FIG. 1*b*, the hysteresis loss is directly proportional to the width of an individual superconducting filament.

An example of a low loss high temperature superconductor tape patterned into a multifilamentary structure and subdivided by electrically resistive barriers as shown at 106 in FIG. 1 is described in reference [1] herein. Thus, in order to decrease the loss and/or accommodate the mechanical limitations of second generation superconductor materials such as yttrium barium copper oxide coated conductors, the use of multifilament coated conductor in combination with the new approaches to winding coils is desirable. Such windings for rotor and stator portions of a rotating machine and for static "machines" such as transformers or solenoids may take on several different physical forms as are disclosed in the following paragraphs.

Double Pancake Coil

Figure 2A:
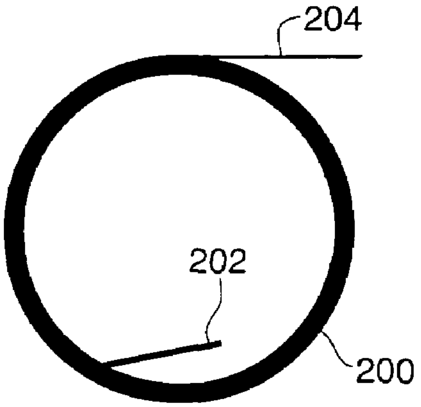
FIG. 2 includes the views of FIG. 2*a* and FIG. 2*b* and shows views of two pancake coils according to the present invention.
Figure 2B:
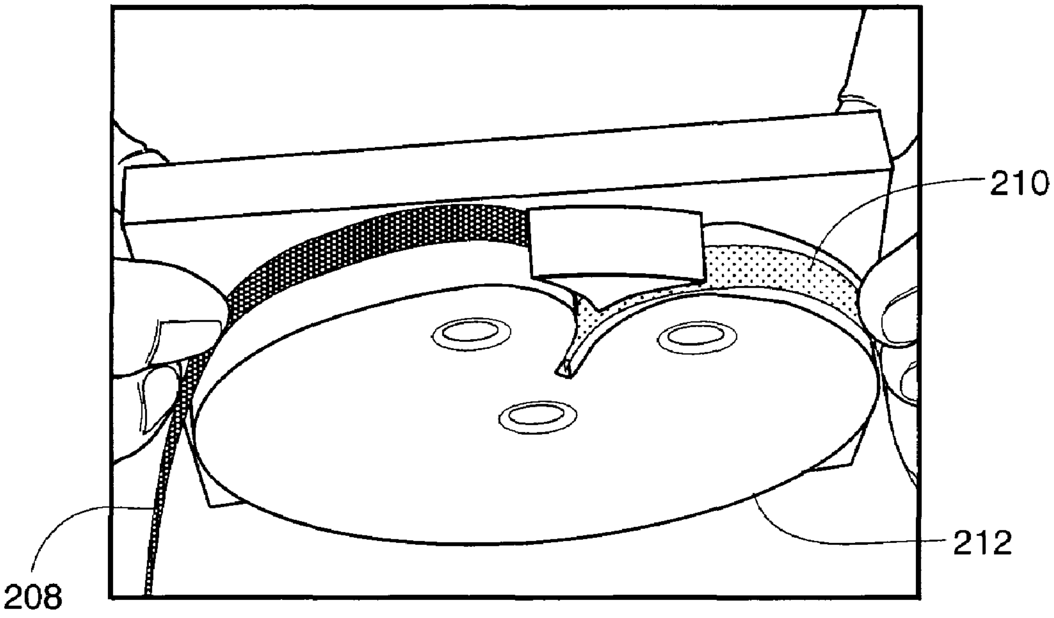

The double pancake coil is a preferred form of making the field coil windings in rotating machinery because each of the coil ends are located on the coil exterior as is opposed to being located in outside and inside locations as occurs in a simple single pancake coil [2]. FIG. 2*a* of the present drawings illustrates how the winding start turn 202 remains within the interior of a coil 200 and the winding finish turn 204 is located on the coil exterior in a single pancake coil winding. In contrast FIG. 2*b* in the drawings illustrates how a first winding terminal 208 and a second winding terminal 210 each remain on the exterior of a double pancake coil formed around the winding mandrel 212 if the winding connection arrangement described subsequently herein is used.

Figure 3:
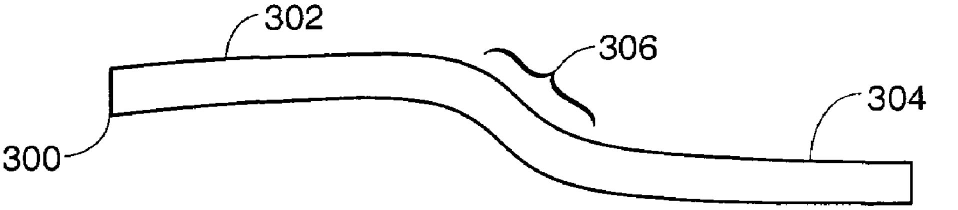
FIG. 3 shows a conductor material disposed in a difficult superconductor bend pattern.

FIG. 3 in the drawings illustrates a winding interconnection arrangement often used in forming the turns of a high current winding portion 300 when the winding in question is made of flexible material such as copper. FIG. 3 type winding shapes often appear in automotive starter motors for example. The interconnection region 306 of the winding portion 300 is however of special concern when superconductor materials are used. There are indications in reference [3] for example that the FIG. 3 illustrated lateral or sideways bending, in the region 306 of FIG. 3 where the innermost turns of a double pancake coil join the outermost turns, degrades the current-carrying capacity of first generation superconductor wires, conductor wires based on the bismuth strontium calcium copper oxide superconductor material. Making a double pancake coil from the second generation wire preferred for present invention use appears even more problematic with the FIG. 3 bending situation because of the much higher rigidity of present invention flat metal tape with respect to the sideways bending shown in FIG. 3. This leads to one aspect of the present invention.

Figure 4A:
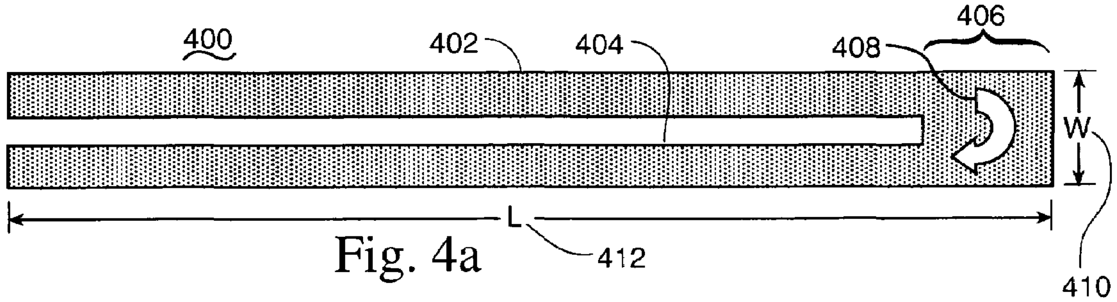
FIG. 4 includes the views of FIG. 4*a* and FIG. 4*b* and shows two views of a slit superconductor winding element.

FIG. 4 in the drawings shows one way to overcome the FIG. 3 problem of lateral deformation in flat wide superconductor inclusive tapes such as are preferred for the present invention. In the FIG. 4*a* portion of FIG. 4 a long tape conductor 400 is shown to be cut into two branches 402 and 404 with the remaining (uncut) part of the conductor tape at 406 allowing the current to flow between the tape branches (as is shown by the arrow 408). If W and L are respectively the width and length of the initial conductor, as shown at 410 and 412 in FIG. 4, the resultant cut conductor will have approximately a width of W/2 and will be twice as long as the initial conductor segment.

Figure 4B:
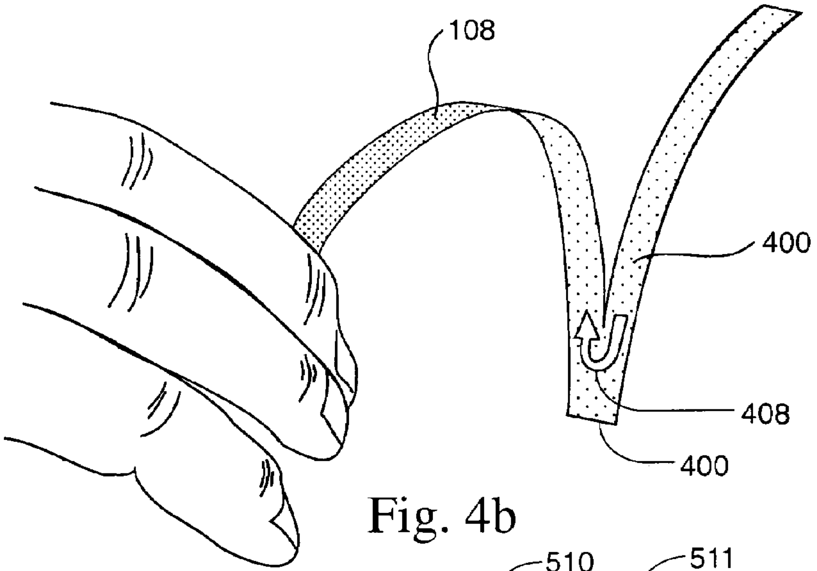

The uncut area 406 in the FIG. 4 conductor need only be ($W \times W/2$) or greater in dimensions in order to maintain the same current-carrying capacity (i.e., the critical current characteristics) in the conductor as that in both conductor branches. Coated conductors are currently produced as wider tapes that may be later mechanically sliced into conductors of a desired width. For example, the manufacturer SuperPower Inc. of 450 Duane Avenue, Schenectady, N.Y., [4] makes 12 millimeter wide tape which may be sliced into three 4 millimeter wide tapes of the same length in the manner of FIG. 4*a*. According to the invention therefore, a 12 millimeter wide tape of length L can be sliced as shown in FIG. 4*a* into a conductor of approximately 6 millimeters width and length 2L. FIG. 4*b* shows a view of a partially expanded conductor 400 cut as shown in FIG. 4*a* and ready for use in winding fabrication. The two different conductor surfaces are also apparent in the FIG. 4*b* drawing.

Figure 5:
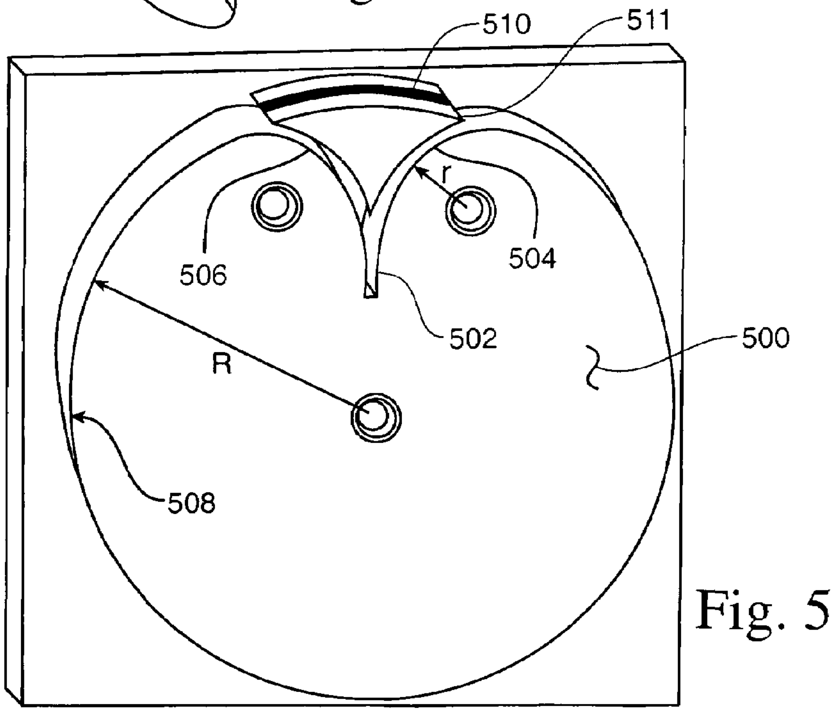
FIG. 5 shows a winding mandrel or bobbin for a conductor as shown in FIG. 4.

In FIG. 5 a useful tool in working with conductor of the FIG. 4 type is shown. In the FIG. 5 instance, the end face of the coil former 500 includes a radial slot 502 and two quarter circle (of radius r) curvilinear slots 504 and 506 leading to the outer rim or periphery 508 of the coil former 500. In the coil former or mandrel or bobbin 500 the quarter circle slots 504 and 506 may be permanent, as achieved by cuts in the mandrel 500, or formed by fixed or removable inserts. Similarly the caps 510 and 511 may be embodied as permanent or removable members. In a later drawing herein the use of a cap structure that is split in the thickness dimension is found to be advantageous. The coil former or mandrel 500 may be fabricated from metallic or nonmetallic materials including the reinforced phenol based easily machined plastic materials depending on the tool life needed. A wood based coil former or mandrel 500 has proven useful for early development of the invention.

In using the FIG. 5 coil former 500, the joined or uncut part of the FIG. 4*a* and FIG. 4*b* conductor 400 is inserted into the slot 502 and each branch is then threaded though the respective quarter circle curvilinear slots 504 and 506 to be wound in opposite directions around the outer rim or periphery 508 of the coil former 500. In the resulting winding, the conductor experiences only the bending strain determined by the radius of curvature of the slots at 504 and 506, but no lateral strain. A small section of the conductor inside the quarter circle slots 504 and 506 (of r dependent length) is doubtless subjected to the largest strain as is determined by the radius of the slots 504 and 506. It is notable that in double pancake winding coils of the types implied in either FIG. 4 or FIG. 5 the conductor portions leading into and leading out of the illustrated winding interconnections are indeed additive in nature with respect to their magnetic flux generating characteristics. This follows from the constant flow direction of the winding currents and may be further verified by way of application of the usual right hand rule concerning current flow and generated magnetic flux.

When a superconductor is exposed to a time-varying magnetic field it suffers high losses. In order to reduce these losses in coated conductors the uniform superconducting layer should be replaced by a number of parallel superconducting filaments (stripes). In such multifilament coated conductor the total magnetization loss is the sum of losses in the superconducting layer $Q_s$ and in the normal metal $Q_n$ of the superconductor substrate (predominantly the coupling loss). In the limit of full field penetration this magnetization loss is given by the relationship [1]

$$Q = q_s Bf + q_n (Bf)^2;\ q_s \approx W_n I_c;\ q_n = \frac{\pi^2}{6}\frac{L^2}{R_{eff}}W. \tag{1}$$

Here $I_c$ is the critical current, $W_n$ is the width of an individual stripe, L is half of the twist pitch, $R_{eff}$ is the phenomenological effective coupling resistance that characterizes the coupling loss, and W is the width of the conductor. In a uniform magnetic field a twisted conductor exposes half of its length to the magnetic field face-up and another half face-down. As the result the current loops induced in the superconducting filaments by the changing field have length equal to half of the twist pitch. The length of the current loops L determines the coupling losses according to Eq. (1).

Reduction of the coupling loss can be achieved by increasing conductor effective resistance $R_{eff}$ and by twisting the conductor. In the present invention we concentrate on the latter part of this two-prong effort.

Figure 6A:
FIG. 6 includes the views of FIG. 6*a* and FIG. 6*b* and shows a comparison view of tape like superconductor material having an axial twist and a bending twist respectively.
Figure 6B:
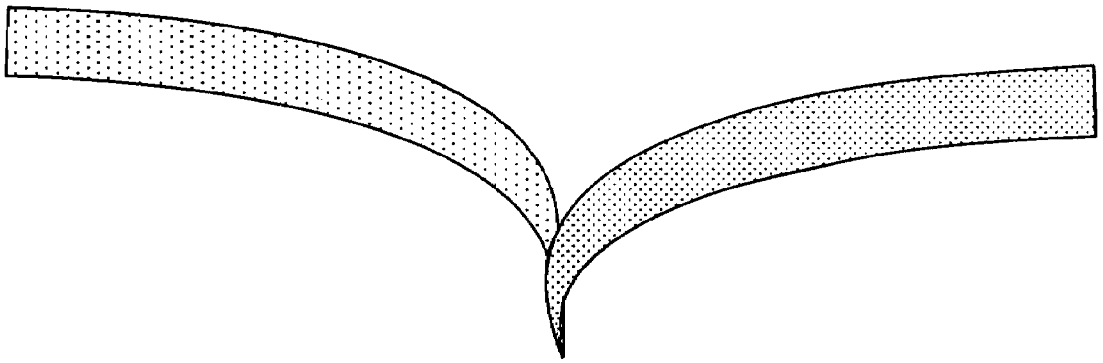

Usually in the literature [5] one can find a description of the axial twist shown in the conductor of FIG. 6*a* herein. In this case the tape is twisted about its longitudinal or long axis. In FIG. 6*b* we show again another deformation option—a conductor "bending twist" arrangement. The bending twist is obtained in the same way as for the conductor shown in FIG. 4*a* and FIG. 4*b*. In an applied magnetic field the conductor shown in FIG. 6*b* will expose each conductor face (indicated by denser and thinner conductor shadings in the drawing) to the magnetic field. The effect of the bending twist on coupling loss is thus the same as that of the regular axial twist shown in FIG. 6*a*. Both types of twist reverse the effective direction of the magnetic flux through the superconductor tape, thereby reducing the coupling losses. Each type of twist has its advantages and disadvantages. There are situations where one twist may be more suitable than the other. In certain situations both types of twist may be employed in order to achieve the maximum benefit.

Figure 7:
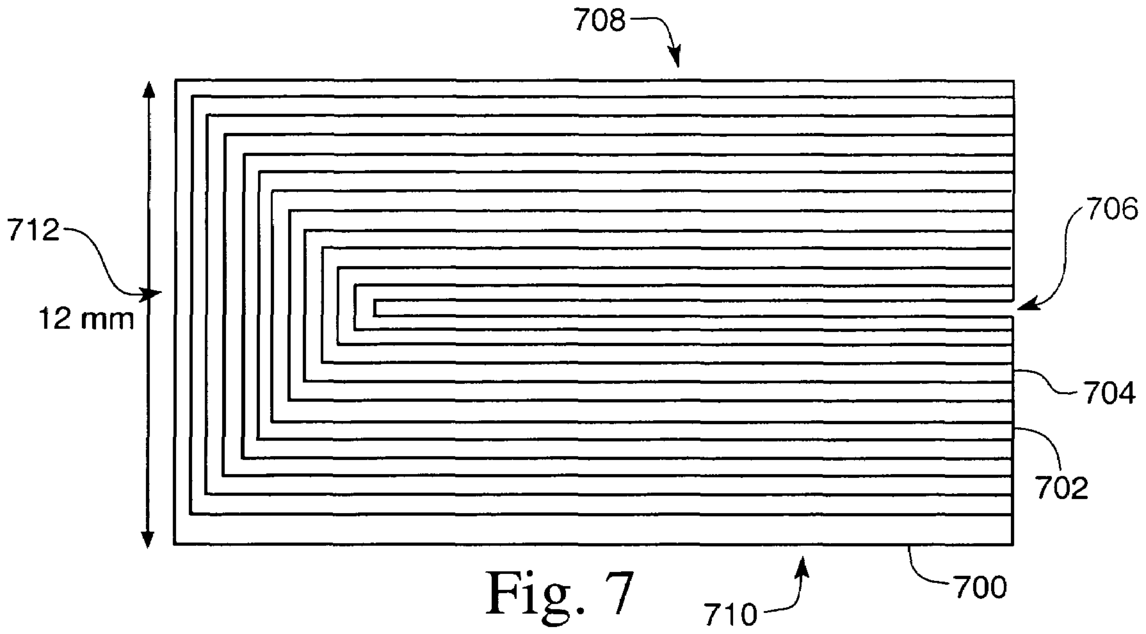
FIG. 7 shows striated superconductor details.

A type of striation that can be used in conjunction with the bending twist is shown in the drawing of FIG. 7. Here a 12 millimeter wide conductor 700 is divided at 706 into 0.5 millimeter wide athletic track lane-like parallel stripes e.g. 702 and 704 by for example laser ablation. The resulting conductor is similar to that shown in the FIG. 1 drawing herein. The FIG. 7 conductor is then cut along the centerline so that the two branches can be bent in opposite directions to form a bending twist as shown in the FIG. 4*b* and FIG. 6*b* drawings. The FIG. 4*b* and FIG. 6*b* bending twist conductor arrangement may also be described as a cusp like profile or a winged seagull profile as a result of the overall appearance of the conductor. The name "cusp" appears in the mathematics field and is defined, for example, in a classic 1950's Thorndike-Barnhart dictionary as "A pointed end." The FIG. 7 conductor includes magnetically active regions 708 and 710 that contribute to the magnetic pole being generated and magnetically inactive region 712 that is oriented orthogonally to the active regions 708 and 710. The magnetically active regions 708 and 710 may extend beyond the lengths shown in FIG. 7 in the manner suggested in the FIG. 9 discussion and in order to connect with additional oppositely oriented right-facing magnetically inactive regions 712, Such a length of alternately right facing and left facing active regions 712 joined by active regions of the 708 and 710 types may be appreciated to define a meander pattern.

Figure 8:
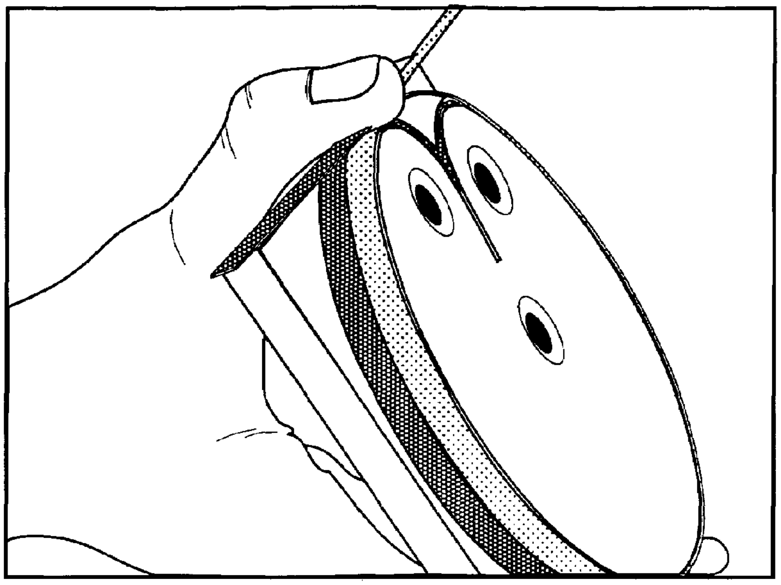
FIG. 8 shows details of a superconductor coil winding.

FIG. 8 in the drawings shows a double pancake coil made from a conductor of the type shown in FIG. 4*a*, FIG. 4*b* and FIG. 6*b* using a mandrel of the type shown in the FIG. 5 drawing. In FIG. 8 the two branches of the coil are shown by the conductor length surface shading used to be transposed (twisted) with respect to each other as is described in the FIG. 6 discussion above. The FIG. 8 double pancake coil also uses the FIG. 4 described conductor interconnection arrangement to advantage in achieving the side by side or axially displaced windings of a double pancake coil.

Coil Construction

Figure 9:
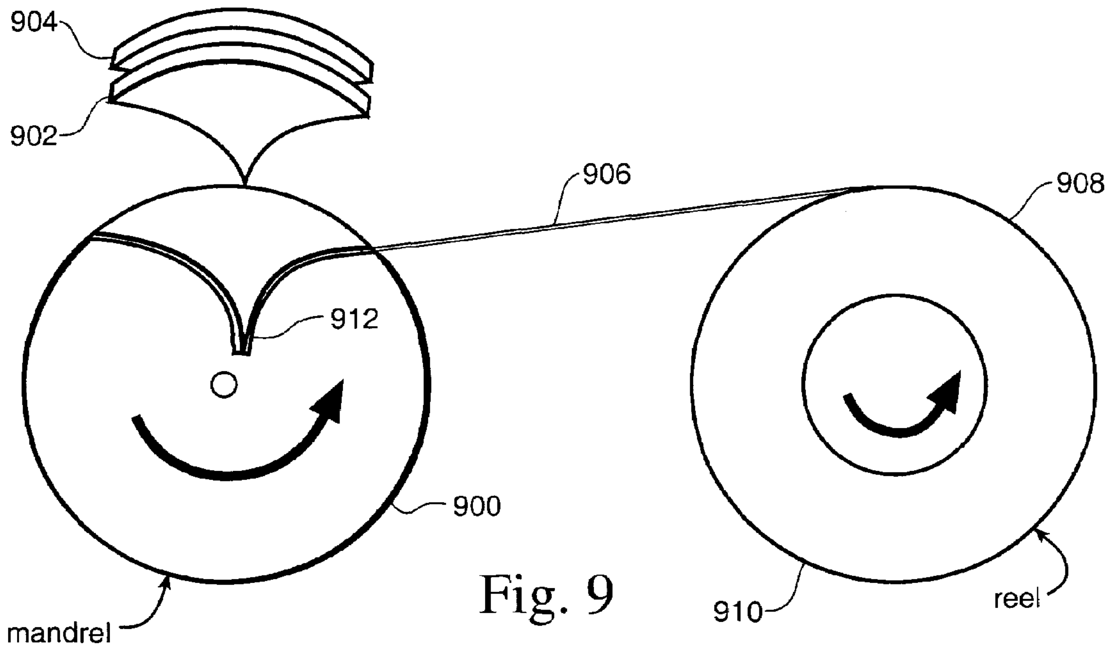
FIG. 9 shows a coil winding formation method.

A double pancake coil of the type shown in FIG. 8 can be fabricated from a coated conductor as shown in FIG. 4*a*, FIG. 4*b* and FIG. 7 as follows. A fabrication mandrel 900 inclusive of one or two removable caps 902 and 904 is shown in the FIG. 9 drawing. Initially a conductor length 906 is wound on a reel 908 as shown in FIG. 9; the uncut area is wound on to the periphery 910 of the reel. The uncut area of the reel-contained conductor is then placed in the radial slot 912 of the mandrel 900, then the conductor is covered by the removable caps 902 and 904 and both conductor branches are wound on to the mandrel 900. When the conductor 906 is almost completely wound on the mandrel 900, one of the branches is disconnected from the reel 908 and attached temporarily to the periphery of the mandrel coil. Then the direction of rotation of the mandrel and the reel are reversed and the branch yet attached to the reel is wound back on to the reel. The appropriate one of the caps 902 and 904 is then temporarily removed allowing the mandrel 900 to continue to continue to rotate and is then replaced while rotation continues in the same direction.

Pancake Coil with Resistive Joint.

In some situations it may be advantageous to make a pancake coil using conventional second or first generation tape-like conductors. In order to avoid a hard bend of such conductor, two conductors can be spliced using a wider segment of coated conductor as is shown in the drawing of FIG. 10. For example, two long 4 millimeter wide coated conductors 1002 and 1004 can be soldered to a 12 millimeter wide coated conductor 1006 as is shown in the FIG. 10 drawing. Such conductors need to be soldered "face to face", so that the yttrium barium copper oxide layers of the soldered conductors are separated by the minimum amount of normal metal including the silver cap layer and copper stabilizer as shown in FIG. 1 herein. The length of the soldered conductor part 1006 in FIG. 10 can be comparable to the internal circumference of the coil and therefore can be of several centimeters extent. Unlike the previously described FIG. 3 arrangement wherein the superconductor current path is entirely superconducting, in the FIG. 10 arrangement the transitional area between the two conductor branches has finite electrical resistance. The advantage of this arrangement which makes use of the wider coated conductors manufactured today is that the resistance of the joint can be made very small. The current between the two FIG. 10 branches flows through the superconductor. Therefore, the resistance of the joint does not depend on the distance between the two branches. The resistance of the FIG. 10 joint is determined by the resistance of the interface between the yttrium barium copper oxide and the silver cap layer and by the normal resistance of the solder and stabilizer in the second generation superconductor of the present invention:

$$R = \frac{2R_0}{Wl} + \frac{2\rho d}{Wl} \qquad (2)$$

Here $R_0$ is the interface resistivity. As shown in Reference [6] the value of $R_0 \approx 5\times10^{-8}\ \Omega cm^2$ is appropriate. Here p and d respectively are predominately the resistivity and thickness of the copper stabilizer. At a temperature of T=77 K the resistivity of copper $\rho \approx 0.2\times10^{-6}\ \Omega cm$. The thickness of the stabilizer d≈80 μm. Thus, $\rho d \approx 1.6\times10^{-9}\ \Omega cm^2$, which is much smaller than the interface resistivity and, therefore, the main contribution to the resistance of the joint is the interface resistance. If the width of the conductors is 4 mm and the length l along which they are soldered to the connecting coated conductor l=1 cm, the resultant resistance is $R \approx 2.5\times10^{-7}\Omega$. If, for example, the current I flowing through these spliced conductors is 100 A, the total power dissipation: $Q = RI^2 \approx 2.5\times10^{-3}$ W, which is an acceptable level of power loss.

Figure 10A:
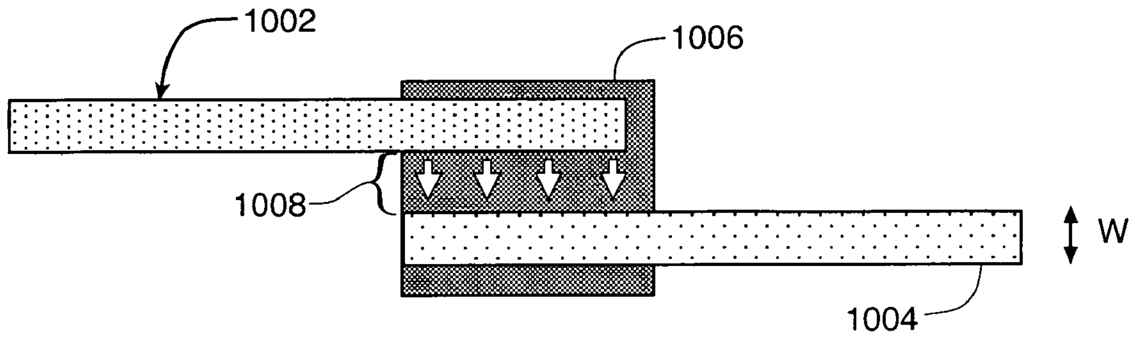
FIG. 10 includes the views of FIG. 10*a* and FIG. 10*b* and shows two alternate arrangements for joining superconductor inclusive materials into a single winding conductor.
Figure 10B:
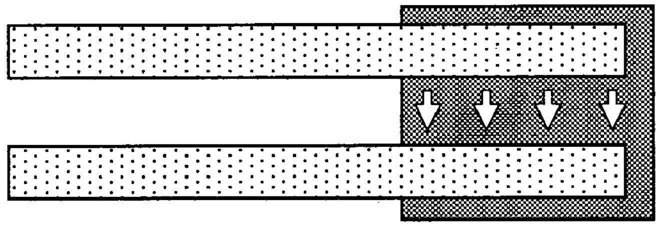

If the superconductor containing conductors are spliced as shown in FIG. 10*a* the resultant conductor can be wound as a conventional double pancake coil. The conductors spliced as shown in FIG. 10*b* are similar to the all-superconducting tape as shown in FIG. 4*a* and FIG. 4*b* and can be wound as described above.

SUMMARY

Herein is presented a novel approach to accomplishing a bending twist of tape-like conductors similar to the $2^{nd}$ generation YBCO coated conductors. The construction of both superconductor DC field coils and AC transformer coils, as well as superconducting stator windings may benefit from the described approach. The approach is based on an unusual manner of cutting wide sheets of coated conductors into narrow tapes of filaments or striations as has been illustrated in FIG. 1 through FIG. 3. Although the illustrations given here are simple, they indicate the potential of new winding configurations based on coated conductor technology.

The foregoing description of the preferred embodiment has been presented for purposes of illustration and description. It is not intended to be exhaustive or to limit the invention to the precise form disclosed. Obvious modifications or variations are possible in light of the above teachings. The embodiment was chosen and described to provide the best illustration of the principles of the invention and its practical application to thereby enable one of ordinary skill in the art to utilize the inventions in various embodiments and with various modifications as are suited to the particular scope of the invention as determined by the appended claims when interpreted in accordance with the breadth to which they are fairly, legally and equitably entitled.

REFERENCES

Each Hereby Incorporated by Reference Herein

1. G. A. Levin, P. N. Barnes, J. W. Kell, N. Amemiya, Z. Jiang, K. Yoda, and F. Kimura, Appl. Phys. Lett. 89, 012506 (2006) (Including references identified therein)
2. M. Polak, E. Demencik, L. Jansak, P. Mozola, D. Aized, C. L. H. Thieme, G. A. Levin, and P. N. Barnes, Appl. Phys. Lett. 88, 232501 (2006)
3. S. W. Kim et al. IEEE Trans. Appl. Supercond. 13, 1784 (2003).
4. Y.-Y. Xie, et al. Physica C 426-431, 849-857 (2005).
5. C. E. Oberly et al. Cryogenics 41, 117 (2001).
6. Polak, G. A. Levin, and P. N. Barnes, Superconductor Science and Technology 19, 817 (2006)

We claim:

1. A method of fabricating a high temperature superconductor film layer inclusive multiple turn, multiple coil electrical winding, said method comprising the steps of:

dividing a planar sheet of high temperature superconductor film coated electrical conductor material into segregated lengths of tape conductor having conductor interconnecting regions located at one end of each tape conductor, said conductor dividing step forming an extended connected meander-like pattern of tape conductors in said sheet of high temperature superconductor film coated electrical conductor material; and forming said divided pattern tape conductors into axially segregated multiple turned continuous electrical winding coils wherein each said conductor interconnecting region comprising a portion of said coil includes a length of said high temperature superconductor coated tape conductor.

2. The method of fabricating a high temperature superconductor film layer inclusive multiple turn, multiple coil electrical winding of claim 1 wherein said step of forming said divided pattern tape conductors into axially segregated multiple turned continuous electrical winding coils includes disposing said interconnected conductors into a cusp like relationship and forming electrical winding coils on opposed sides of said cusp like conductor relationship in opposed rotational directions.

3. The method of fabricating a high temperature superconductor film layer inclusive multiple turn, multiple coil electrical winding of claim 1 wherein each said conductor interconnecting region comprises a planar portion of said planar sheet of high temperature superconductor film coated electrical conductor material.

4. The method of fabricating a high temperature superconductor film layer inclusive multiple turn, multiple coil electrical winding of claim 1 further including the step of adding a supplemental conductor element to said planar sheet of high temperature superconductor film coated electrical conductor tape elements in joining said conductor interconnecting regions.

5. The method of fabricating a high temperature superconductor film layer inclusive multiple turn, multiple coil electrical winding of claim 1 further including the step of disposing said continuous electrical winding coils into a concentric spiral of winding turns.

6. The method of fabricating a high temperature superconductor film layer inclusive multiple turn, multiple coil electrical winding of claim 1 further including the step of disposing said continuous electrical winding coils into one of a solenoid coil and a layered coil.

7. The method of fabricating a high temperature superconductor film layer inclusive multiple turn, multiple coil electrical winding of claim 1 wherein said continuous electrical winding coils comprise a portion of a multiple phased electrical winding set.

8. The method of fabricating a high temperature superconductor film layer inclusive multiple turn, multiple coil electrical winding of claim 1 further including the step of disposing a twist pattern along a lengthwise axis of said tape conductor.

9. The method of fabricating a high temperature superconductor film layer inclusive multiple turn, multiple coil electrical winding of claim 1 further including the step of dividing said sheet of high temperature superconductor film coated electrical conductor material into electrically segregated conductor striations conforming with said segregated lengths of tape conductor and said connected meander-like pattern.

10. A method of fabricating a low loss high temperature superconductor coating inclusive winding for an electrical machine, said method comprising the steps of:

disposing a complementing meander of conductor voids in a planar sheet of yttrium barium copper oxide superconductor coated electrical conductor material;

said conductor void meander forming an extended connected capital letter U-like pattern of tape conductor in said sheet of yttrium barium copper oxide superconductor coated electrical conductor material;

unfolding said meander pattern of tape conductor from said planar sheet configuration to form a length of tape conductor having curvilinear length portions segregated by bending twist regions intermediately disposed therein; and forming said unfolded meander pattern tape conductor into a multiple turned continuous spiral electrical winding coil.

11. The method of fabricating a low loss high temperature superconductor coating inclusive winding for an alternating current electrical machine of claim 10 wherein said curvilinear length portions comprise magnetic pole conductor active regions and said bending twist regions comprise conductor active region interconnections in said electrical winding coil.

12. The method of fabricating a low loss high temperature superconductor coating inclusive winding for an electrical machine of claim 11 wherein said bending twist regions are located in a plane differing from that of said conductor active regions in said electrical winding coil.

13. The method of fabricating a low loss high temperature superconductor coating inclusive winding for an electrical machine of claim 10 wherein said tape conductor bending twist regions are located in a plane radially disposed with respect to said conductor active regions in said electrical machine winding.

14. The method of fabricating a low loss high temperature superconductor coating inclusive winding for an electrical machine of claim 10 wherein said machine is an alternating current electrical machine and further including the step of forming an array electrically isolated striation filament electrical paths conforming with said meander pattern in said planar sheet of yttrium barium copper oxide superconductor coated electrical conductor material.

15. The method of fabricating a low loss high temperature superconductor coating inclusive winding for an electrical machine of claim 10 wherein said step of forming said unfolded meander pattern tape conductor into a multiple turned continuous spiral electrical winding coil includes fabricating said electrical winding coil on a winding form having a first periphery portion shaping said magnetic pole conductor active regions and a second recessed portion receiving said meander pattern conductor bending twist regions.

16. The method of fabricating a low loss high temperature superconductor coating inclusive winding for an electrical machine of claim 10 further including the step of disposing said winding in an electrical machine magnetic circuit structure in an orientation minimizing magnetic field components disposed perpendicular to a lateral face portion of said tape conductor.

17. The method of fabricating a low loss high temperature superconductor coating inclusive winding for an electrical machine of claim 10 wherein said electrical winding is a portion of a multiple phase electrical winding set.

* * * * *